(12) United States Patent
Tobin et al.

(10) Patent No.: US 6,255,204 B1
(45) Date of Patent: Jul. 3, 2001

(54) METHOD FOR FORMING A SEMICONDUCTOR DEVICE

(75) Inventors: Philip J. Tobin; Olubunmi O. Adetutu; Rama I. Hegde; Bikas Maiti, all of Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/316,012

(22) Filed: May 21, 1999

(51) Int. Cl.[7] .............................................. H01L 21/4763
(52) U.S. Cl. ............................................................ 438/592
(58) Field of Search ...................... 438/585, 589, 438/592, 631, 633–634, 628, 636, 637, 656, 660, 663, 669, 688, 675, 627, 643, 653, 957; 257/751

(56) References Cited

U.S. PATENT DOCUMENTS

| | | |
|---|---|---|
| 4,977,100 | 12/1990 | Shimura . |
| 5,702,981 | 12/1997 | Maniar et al. . |
| 5,902,130 * | 5/1999 | Passlack et al. ..................... 438/604 |
| 5,994,736 * | 11/1999 | Sugawara et al. ................... 257/330 |
| 6,001,698 * | 12/1999 | Kuroda .................................. 438/303 |
| 6,057,217 * | 5/2000 | Uwasawa ............................. 438/585 |
| 6,066,891 * | 5/2000 | Yamaoka et al. ..................... 257/751 |

OTHER PUBLICATIONS

A. Chatterjee et al., "Sub–100nm Gate Length Metal Gate NMOS Transistors Fabricated by a Replacement Gate Process", 1997 IEEE, pp. 821–824.

J.C.Hu et al., "Feasibility of Using W/TiN as Metal Gate for Conventional 0.13 um CMOS Technology and Beyond", 1997 IEEE, pp. 825–828.

Yasushi Akasaka, et al., "Low–Resistivity Poly–Metal Gate Electrode Durable for High–Temperature Processing",Nov. 1996 IEEE Transactions on Electron Devices, vol. 43, No. 11, pp. 1864–1868.

Bi–Shiou Chiou et al., "Microstucture and Properties of Multilayer–Derived Tungsten Silicide", Journal of Electronic Materials, vol. 16, No. 4, 1987, pp. 251–255.

A. Chatterjee et al., "CMOS Metal Replacement Gate Transistors using Tantalum Pentoxide Gate Insulator", Dec. 1998 International Electron Devices (Electron Dev. Society of IEEE), 4 pgs.

Pradeep L. Shah, "Refractory Metal Gate Processes for VLSI Applications", Apr. 1979 IEEE Transactions on Electron Devices, vol. ED–26, No. 4, pp. 631–640.

* cited by examiner

*Primary Examiner*—Matthew Smith
*Assistant Examiner*—Calvin Lee
(74) *Attorney, Agent, or Firm*—Robert A. Rodriguez

(57) ABSTRACT

A first metal-containing material (22) is formed over a semiconductor device substrate (10). A second metal-containing material (32) is formed over the first metal containing material (22). The combination of the second metal-containing material (32) formed over the first metal-containing material (22) forms a metal stack (34). The metal stack (34) is annealed and a post-anneal stress of the metal stack (34) is less than an individual post-anneal stress of either one of the first conductive film (22) or the second conductive film (32).

19 Claims, 4 Drawing Sheets

METHOD FOR FORMING A SEMICONDUCTOR DEVICE

FIELD OF THE INVENTION

The present invention relates generally to a process for forming a semiconductor device, and more particularly, to a process for forming semiconductor devices having metal electrodes.

BACKGROUND OF THE INVENTION

The use of conventional gate electrode and gate dielectric materials is becoming increasingly problematic as feature sizes of semiconductor devices are continuing to be scaled to smaller dimensions. Among the problems encountered include increased resistance of the gate electrode, leakage of the gate dielectric, and polysilicon gate depletion effects. In an effort to overcome these problems, alternative materials are being investigated to replace conventional gate dielectric and gate electrode materials.

Refractory metals, refractory metal alloys, their nitrides, and aluminum are alternative materials currently being investigated for use as gate electrodes. These materials offer potential advantages over materials such as polysilicon because of their patternability, low sheet resistance, and scalability to advanced metal oxide semiconductor technologies. Among the refractory metals currently being considered include titanium, tantalum, tungsten, molybdenum, zirconium, or the like.

In selecting refractory metal materials for use as a gate electrode, a number of factors must be considered. Among these include the electrical, chemical, and physical properties of the refractory metal material. The selection process is further complicated because these properties can change as the refractory metal material is subjected to various thermal processing steps. Failure to compensate for these thermally induced changes can impact yield and potentially affect the reliability of the semiconductor device.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

In accordance with an embodiment of the present invention, a first metal-containing material is formed over a semiconductor device substrate, and a second metal-containing material is formed over the first metal containing material. The combination of the first metal-containing material and the second metal-containing material forms a metal stack. The metal stack is annealed, wherein the compressive/tensile stress of the metal stack after anneal is less than an individual stress of either one of the first conductive film or the second conductive film after the anneal. The film stack can be used to form conductive electrodes for semiconductor devices. The electrodes can be formed using conventional patterning and etching processes or as inlaid features.

Figure 1:
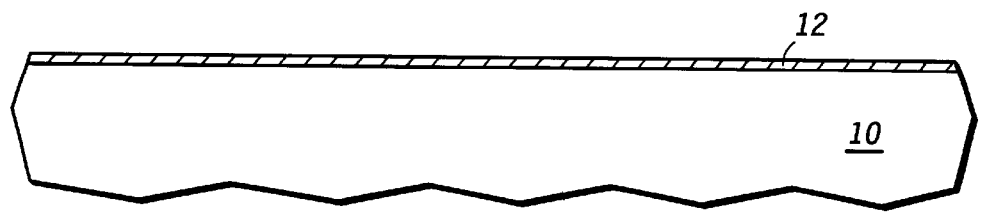
FIGS. 1–6 include illustrations of cross-sectional views of a semiconductor device substrate in accordance with a first set of embodiments.

Embodiments of the present invention will now be described more fully with references to the accompanying figures. Shown in FIG. 1 is a cross-sectional view of a gate dielectric layer 12 overlying a semiconductor device substrate 10. As used in this specification, a semiconductor device substrate includes a monocrystalline semiconductor wafer, a semiconductor-on-insulator wafer, or any other substrate used in forming semiconductor devices.

In one embodiment, the gate dielectric layer 12 includes a refractory metal oxide, such as tantalum pentoxide, titanium dioxide, or the like. Alternatively, the gate dielectric layer 12 can include silicon dioxide, a silicon oxynitride, or a high-k dielectric material. For the purposes of this specification, a high-k dielectric material is a dielectric material having a dielectric constant greater than approximately 10. Examples of high-k dielectric materials include strontium titanate (STO), barium strontium titanate (BST), and lead zirconate titanate (PZT). If high-k dielectric materials such as these are used, then a barrier layer (not shown) may be used to separate the high-k dielectric material and the semiconductor device substrate 10 in order to reduce the likelihood of adverse interactions between the two materials. Examples of such barrier layers include silicon nitride, aluminum nitride, or the like.

Figure 2:
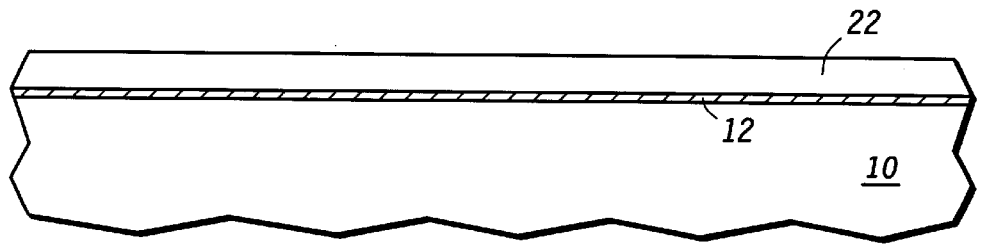

FIG. 2 further illustrates that a first conductive film 22 is formed over the gate dielectric layer 12. In this particular embodiment, the first conductive film 22 has a thickness in a range of approximately 10–30 nanometers. The first conductive film 22 is formed using a refractory metal, a refractory metal nitride, a refractory metal carbide, or an alloy of a refractory metal. The first conductive film 22 can be formed using physical vapor deposition (PVD) or chemical vapor deposition (CVD) methods that include plasma enhanced CVD (PECVD) and thermal CVD (Th-CVD). In one particular non-limiting embodiment, the first conductive film 22 is a titanium nitride film formed by a thermal CVD (Th-CVD) process. As used in this specification a Th-CVD process is generally characterized as a non-plasma assisted CVD process which is performed using thermal energy supplied by conventional resistance-heating methods. The Th-CVD process is typically performed at a temperature in a range of approximately 300–750° C. to minimize thermally induced interactions with other materials. The Th-CVD deposited titanium nitride film is generally deposited as a tensile stress film. The refractory metal precursors used to form the conductive film 22 typically include halogen atoms such as fluorine, chlorine, bromine, iodine, or the like. Tungsten hexafluoride, titanium iodide, and titanium tetrachloride are examples of such refractory metal precursors. If a refractory metal nitride is being formed, a nitrogen source gas such as ammonia, nitrogen, or the like can additionally be used.

Figure 3:
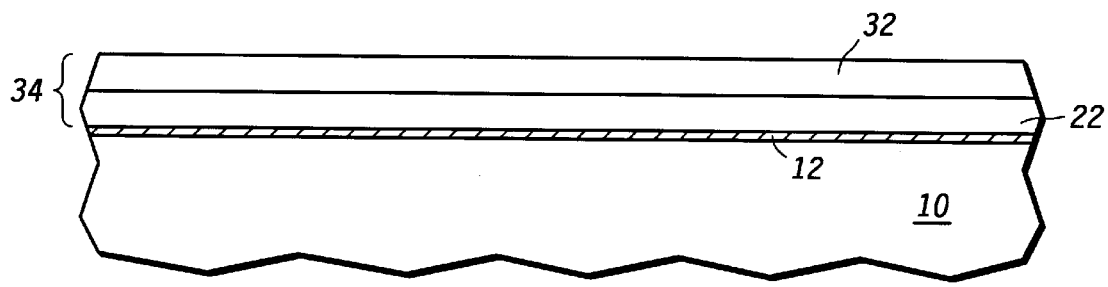

FIG. 3 illustrates a second conductive film 32 is formed over the first conductive film 22. The second conductive film 32 can be formed using a refractory metal, a refractory metal nitride, a refractory metal carbide, or an alloy of a refractory metal. The second conductive film 32 can be formed using a PVD, PECVD, or Th-CVD process. In one particular non-limiting embodiment, the second conductive film 32 is a titanium nitride film deposited using a PECVD process at a temperature in a range of approximately 250–500° C. and at a power in a range of 200–500 Watts (W). Typically, the second conductive film 32 has a thickness in a range of approximately 20–100 nanometers. In this particular embodiment the thickness of the second conductive film 32 is in a range of approximately 30–60 nanometers. Both PECVD and PVD deposited titanium nitride films are generally deposited as a compressive stress film. The combination of the first and second conductive films 22 and 32 forms a gate electrode film stack 34 as shown in FIG. 3. The significance of the stress of the two films in a final composite gate electrode structure will subsequently be discussed. In alternative embodiments, the first and second conductive films 22 and 32 can be formed as refractory metals, refractory metal alloys, and nitrides of refractory metals and refractory metal alloys. Among the refractory metals used in these combinations include titanium, tantalum, tungsten, molybdenum, zirconium, and the like. In yet another alternative embodiment, at least one of the first and second conductive films 22 and 32 can include aluminum.

Figure 4:
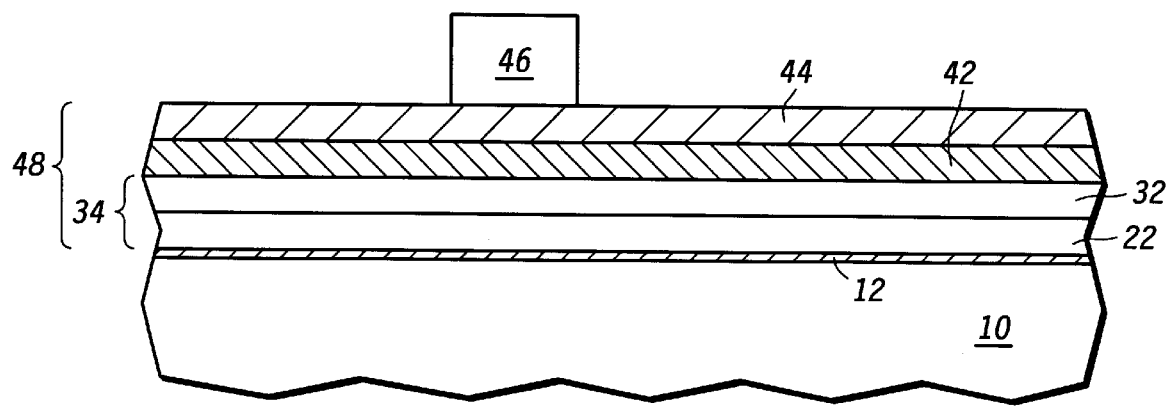

An insulating layer 42 and an antireflective layer 44 are then deposited over the gate electrode film stack 34 to form the film stack 48, as shown in FIG. 4. The insulating layer 42 is formed using conventional methods and typically includes an oxide, a nitride, an undoped silicon layer, or the like. The thickness of the insulating layer 42 is generally in a range of approximately 20–150 nanometers. The antireflective layer 44 is formed using conventional methods and typically includes a nitride-containing material. The antireflective layer 44 can include a silicon-rich silicon nitride, a silicon oxynitride, or a metal-rich metal nitride, wherein the silicon or metal concentration is at least 10 atomic percent higher than the nitrogen concentration in the film. The thickness of the antireflective layer 44 is generally in a range of approximately 20–120 nanometers. A patterned resist member 46 is then formed over the film stack 48. The patterned resist member 46 corresponds to a location where a gate electrode will subsequently be formed.

Figure 5:
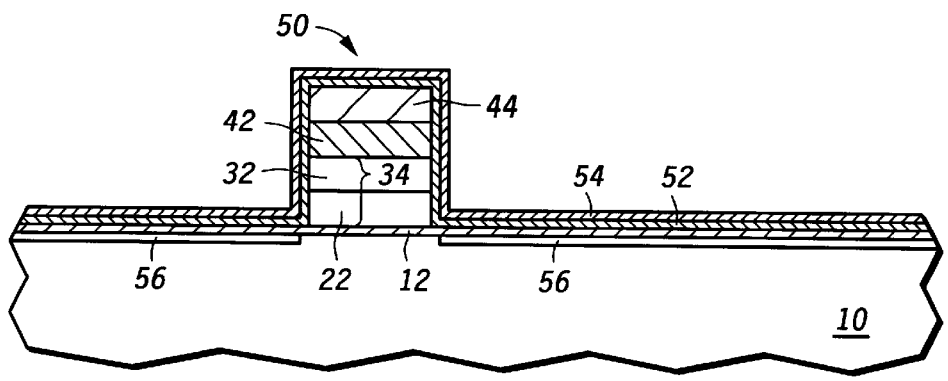

The film stack is then etched to form a gate 50, as shown in FIG. 5. A nitride layer 52 and an oxide layer 54 are then formed over the gate 50 and the substrate 10 using conventional deposition methods. The thickness of each of the layers 52 and 54 is typically no more than approximately 15 nanometers. After forming the nitride layer 52 and prior to forming the oxide layer 54 the substrate 10 is ion implanted to form doped extension regions 56.

Figure 6:
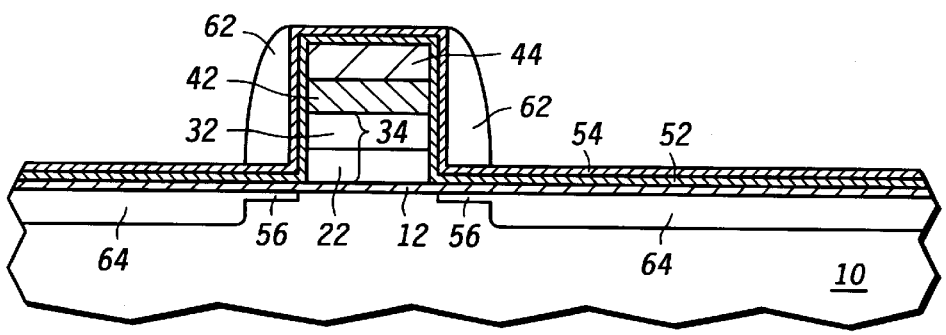

Sidewall spacers 62 are then formed adjacent the gate stack as shown in FIG. 6. The sidewall spacers 62 are typically formed using nitride materials using conventional deposition methods. Alternatively, the sidewall spacers 62 can include oxides or other insulating materials. After forming the sidewall spacers 62, the substrate 10 is implanted with an N-type or P-type dopant and then thermally processed (annealed) to form the source/drain doped regions 64. In one embodiment, the thermal process is a rapid thermal annealing process (RTP), wherein the RTP temperature in a range of approximately 700–100° C. and the annealing time is less than approximately 1 minute. More typically, the RTP temperature is in a range of approximately 1000–1050° C. and the processing time is in a range of approximately 5–50 seconds. In an alternate embodiment, the thermal process is a furnace annealing process, wherein the temperature is in a range of approximately 700–950° C. and the time is in a range of approximately 5–30 minutes. One of ordinary skill in the art recognizes that these temperatures and times vary according to the dimensions, type, and performance requirements of the semiconductor device being fabricated.

The inventors have recognized that thermal processes, such as the anneal to form the source and drain regions, can significantly change the stress of the first and second conductive films 22 and 32, and further, that these changes can advantageously be used to reduce the overall stress associated with gate electrode film stack 34. The stress of the gate electrode film stack 34 can affect a variety of factors that can negatively impact the semiconductor device. Among them, in particular, include the adhesion of the electrode film stack to underlying surfaces. As the stress of the electrode film stack 34 is reduced so too are tendencies of the electrode film stack 34 to peel, delaminate, or warp. All of which can affect the semiconductor device's yield or reliability.

In addition, the stress associated with the gate electrode film stack 34 can also the stress of underlying films, as well as the diffusivity of dopant species in the substrate 10 near the gate electrode film stack 34. As the stress of the gate electrode film stack 34 is increased, so too is the interstitial diffusion of dopants in the semiconductor substrate crystal lattice below the electrode film stack 34. Boron is a P-type dopant that can diffuse through silicon via both interstitial and vacancy diffusion as compared to arsenic, an N-type dopant, which diffuses through silicon primarily via vacancy diffusion. Therefore, an uncontrolled increase in stress of the underlying substrate 10, produced by the gate electrode film stack 34, can result in a corresponding uncontrolled increase in the interstitial diffusion rate of dopant species, such as boron, within the substrate. An uncontrolled increase in the boron diffusion rate can be undesirable because it can reduce the effective channel length of PMOS transistors. By reducing the stress from the gate electrode film stack 34, the boron diffusion rate is better controlled.

Therefore, in accordance with one embodiment of the present invention, a combination of refractory metal films, instead of a single refractory film are used to form a gate electrode film stack layer. The selection of the refractory metal films, their deposition methods, and their thicknesses can be selected to produce a film stack that, after annealing, has a lower composite stress than any one of the individual films would after a similar annealing process. Typically, the post-anneal stress of the gate electrode film stack 34, as disclosed in the previous embodiment, is less than 800 megapascals, and more often is less than 500 megapascals (the stress of the annealed film stack may be either tensile or compressive). That is compared to the post anneal stress of either one of the individual first and second conductive films which is typically greater than 500 megapascals and more often greater than 1000 megapascals.

Figure 7:
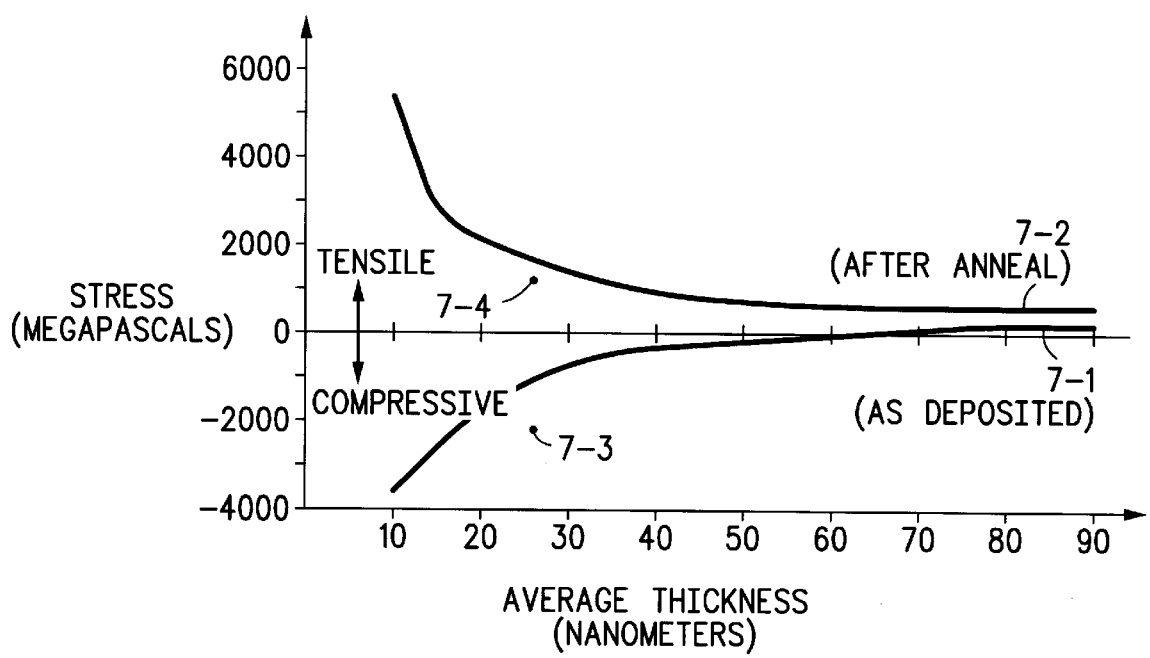
FIGS. 7–8 include illustrations showing the relationship between film stack stress and film stack thickness before and after a thermal annealing process.
Figure 8:
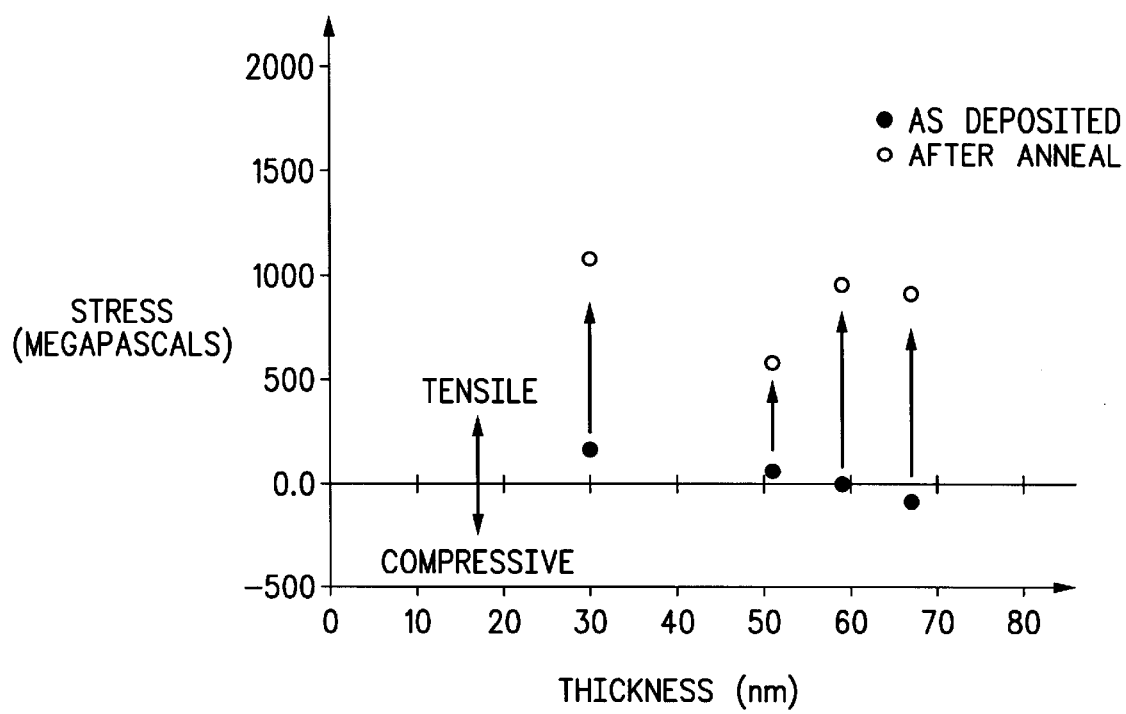

FIGS. 7–8 illustrate the effect that an annealing process can have on the stress of a composite film stack of refractory metal films before and after an annealing process. FIGS. 7–8 further illustrate the effect that the thickness of an individual refractory metal film, within the film stack, can have on the stress of the composite film stack. FIG. 7 illustrates a plot of gate electrode film stack's stress (y-axis) as a function of thickness of one of the gate electrode films (x-axis) for gate electrode film stacks before and after a 60 second anneal at a temperature of approximately 1050° C. Values above zero on the y-axis correspond to tensile stress measurement values, and values below zero on the y-axis correspond to compressive stress measurement values. Line 7-1 and line 7-2 plot the "as deposited" stress (pre-anneal stress) and "after anneal" stress (post-anneal stress), respectively, of the film stack 34, shown in FIGS. 3–6. In this embodiment, the first conductive film 22 is a 25 nm thick layer of PVD titanium nitride and the second conductive film 32 is a layer of PECVD tungsten nitride. The thickness of the second conductive film 32 is indicated on the x-axis. As shown by line 7-1 in FIG. 7, the stress of the as deposited film stack 34 is less than approximately 500 megapascals compressive when the thickness of the conductive film 32 is in a range of approximately 35 to 100 nm. After annealing, as indicated by 7-2, the stress of film stack 34 is below approximately 1000 megapascals tensile only when the thickness of the conductive film 32 is greater than approximately 40 nm. When the thickness of the conductive film 32 is approximately 90 nm, the composite film stress is approximately 400 megapascals tensile. This trend suggests that the stress of the film stack 34, after anneal, may continue to be reduced as the thickness of the second conductive film 32 increases beyond 90 nm.

Points 7-3 and 74 correspond to control data points. Point 7-3 is a measurement of the as deposited stress of a single 25 nm PVD deposited titanium nitride film, and point 7-4 is a measurement of the stress of the 25 nm PVD deposited titanium nitride film after anneal. These data points indicate that the film stress for the as deposited titanium nitride film is approximately 2000 megapascals compressive and the film stress for the post-anneal titanium nitride film is approximately 1200 megapascals tensile. Therefore, as shown in FIG. 7, the electrode film stack 34 that includes films 22 and 32 can produce a lower composite stress film after anneal than a single titanium nitride film, when the thickness of the second conductive film 32 exceeds approximately 35 nanometers.

FIG. 8 similarly plots, as discrete values, the gate electrode film stack's stress (y-axis) as a function of thickness of one of the gate electrode film's (x-axis) for the gate electrode film stack 34 shown in FIGS. 3–6. In this embodiment, the first conductive film 22, is a 25 nm thick layer of Th-CVD titanium nitride and the second conductive film 32 is a layer of PECVD titanium nitride. The thickness of the second conductive film is indicated by values on the x-axis. These measurements indicate that the film stacks initially deposit as relatively low stress film stacks that become higher stress film stacks after annealing. The data indicates that for these specific materials and deposition methods that the stress of the gate electrode film stack 34 is minimized, after the annealing process, when the thickness of the second conductive film is between approximately 32 nm and 58 nm. For example, at 51 nm, the stress is approximately 700 megapascals. Skilled artisans appreciate that optimization of the film stack thickness can be performed without undue experimentation. Furthermore, one of ordinary skill in the art understands that additional films, both conductive and insulative, can be included in the film stack to further optimize its electrical, physical, and chemical properties.

Figure 9:
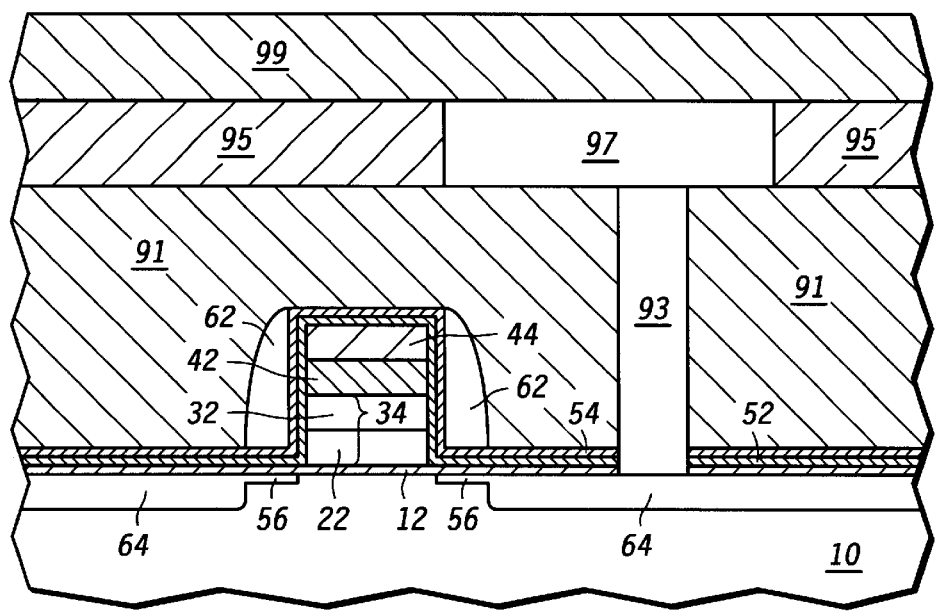
FIGS. 9–13 include illustrations of cross-sectional views of a semiconductor device substrate in accordance with a second set of embodiments.

In FIG. 9, processing is continued to form a substantially completed semiconductor device. First a first interlevel dielectric (ILD) layer 91 is deposited over the substrate and is patterned to form an opening. A conductive plug 93 is then formed to contact one of the doped regions 64. After forming the conductive plug 93, a second ILD layer 95 is formed and patterned to form interconnect trenches. An interconnect 97 is then formed within the interconnect trench. After formation of the interconnect 97, a passivation layer 99 is then formed over the uppermost level of interconnects. Other electrical connections are made to the gate electrode film stack 34 and the other doped region 64 but are not shown in FIG. 9. Additional interconnect levels and other structures can be formed but are not illustrated in FIG. 9. The structure in FIG. 9 can be operated as a transistor or a capacitor.

Figure 10:
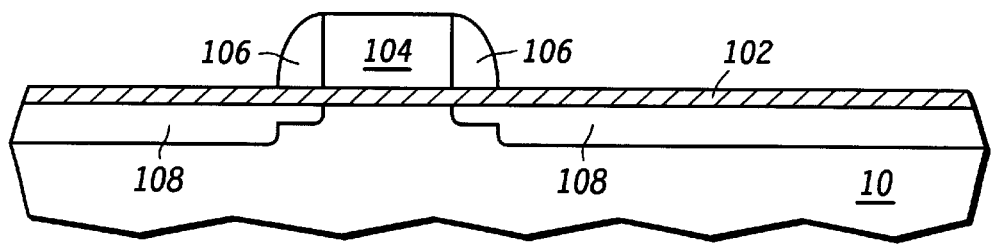

In alternative embodiments, shown in FIGS. 10–13, an inlaid gate electrode stack is formed. In FIG. 10, a pad dielectric layer 102 is formed over the substrate 10. The pad dielectric layer 102 is typically an oxide dielectric layer. A dummy structure 104 is then formed over the pad dielectric layer 102. In this particular embodiment, the dummy structure 104 can include polysilicon, nitride, or the like. The dummy structure 104 is formed using conventional deposition, patterning and etching techniques. Doped extension regions are formed using processes similar to those used to form doped extension regions 56 in FIG. 5. Spacers 106 are then formed adjacent sidewalls of the dummy structure 104. The spacers 106 typically include oxide, nitride or the like. If the pad dielectric layer 102 is oxide, the spacer is generally formed using a dissimilar material, such as a nitride. Alternatively, if the pad dielectric layer 102 is nitride, the spacer can be formed using a dissimilar material such as an oxide. After forming the sidewall spacers 106, the substrate 10 is doped with N-type or P-type dopants. A thermal annealing or oxidation process then forms the doped regions 108 as shown in FIG. 10. The doped regions 108 are similar to the doped regions 64 shown in FIG. 6.

Selection of the materials used for the pad dielectric layer 102, dummy structure 104, and spacers 106 can be chosen to minimize stress on the substrate during the thermal cycle to form the doped regions. For example, polysilicon can be used to form the dummy structure if a dummy structure having a relatively low stress is desired. The stress of deposited polysilicon films are typically in a range of approximately 200–500 megapascals tensile. Similarly, silicon-rich silicon nitride can be used to form the spacers 106 if a nitride material having a relatively lower stress is desired.

Figure 11:
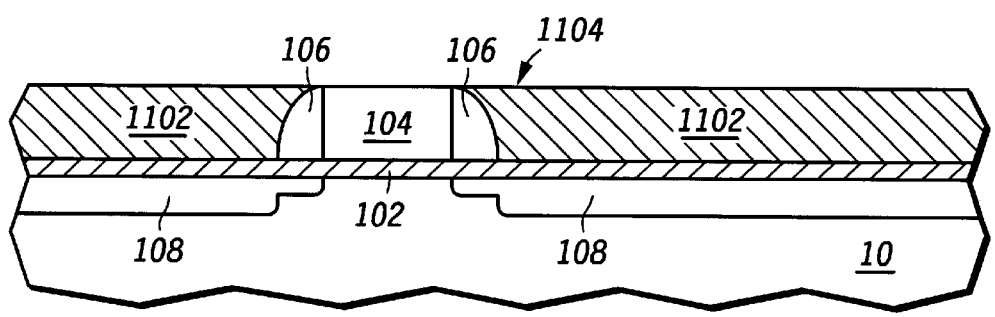

An insulating layer 1102 is then formed over the dummy structure 104 and the substrate 10. After deposition, the insulating layer 1102 is planarized using a chemical mechanical polishing or etching process to produce a substantially planar surface 1104 as shown in FIG. 11. The dummy structure 104 is then removed using conventional plasma or wet chemical etch processes to form a feature opening (not shown).

Figure 12:
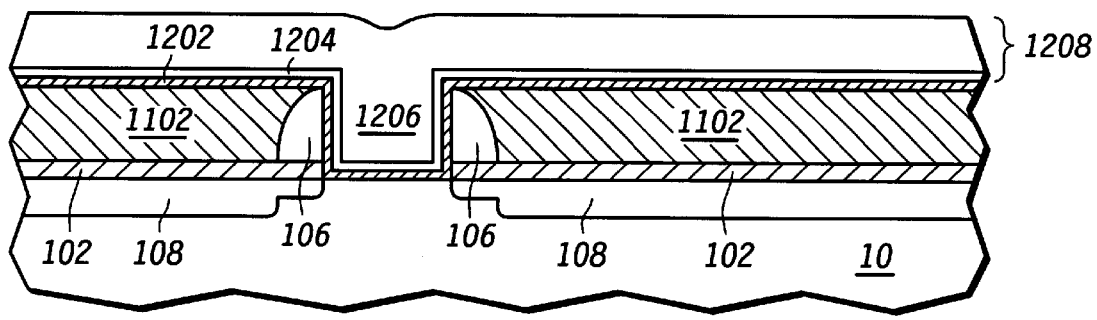

In FIG. 12, a gate dielectric layer 1202 and a gate electrode film stack 1208 are formed over the substrate and within the feature opening previously occupied by the dummy structure. The gate dielectric layer 1202 is formed using materials and thicknesses similar to those previously described to form the gate dielectric layer 12. The gate electrode film stack 1208 comprises first and second conductive films 1204 and 1206 which are formed using materials having thicknesses similar to those previously described to form the first and second conductive films 22 and 32. In accordance with one embodiment the combination of films 1204 and 1206 form the gate electrode film stack 1208 as shown in FIG. 12. In alternative embodiments, where so desired, additional conductive films may additionally be deposited to form the gate electrode film stack 1208.

Figure 13:
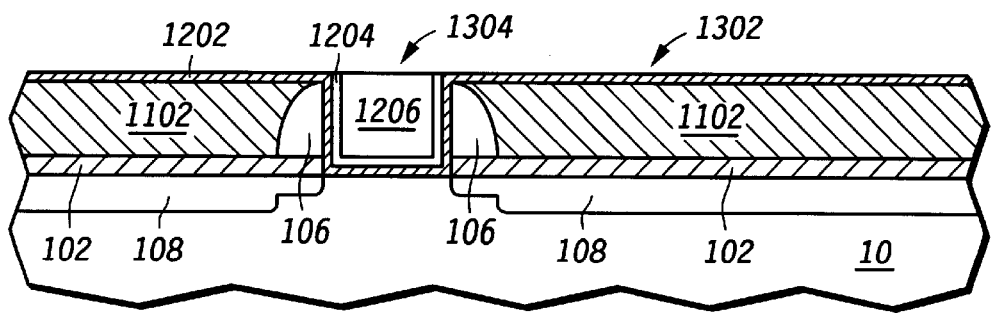

The substrate is then polished to remove the portions of the first and second conductive films 1204 and 1206 lying outside the opening thereby producing a substantially planar surface 112 and forming the gate electrode 1304 as shown in FIG. 13. Processing is continued to form a substantially completed device similar to one shown in FIG. 9.

In this particular set of embodiments, all subsequent anneals necessary to form the substantially completed semiconductor device are performed at temperatures that do not typically exceed approximately 800° C. and for a time period that does not exceed approximately 1 minute. Therefore, any annealing induced stress changes of the inlaid gate electrode film stack 1304 should be less than in the prior embodiments (FIGS. 1–6) because of the lower subsequent processing temperatures. The composite stress associated with the gate electrode film stack 1304 (conductive films 1204 and 1206) should be less than approximately 800 megapascals and more typically is less than 500 megapascals.

Additional benefits of the embodiments herein described include that they can be integrated relatively easily into an existing process flow without having to develop significantly different processes or use of exotic or unusual materials. In addition, the deposition systems to form the stack gate electrode can also easily be integrated onto a single processing platform. In this manner, the formation of the film stack to form the gate electrode can be performed during a single processing sequence, thereby reducing the overall cycle time for forming the film stack. Furthermore embodiments of the present can be extended to include other structures used by semiconductor devices such as capacitors and interconnects.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. Benefits, other advantages, and solutions to problems have been described with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. A method for forming a semiconductor device comprising:

forming a first metal-containing layer over a substrate, wherein the first metal-containing layer has a first pre-anneal compressive/tensile stress;

forming a source region, a drain region and a channel between the source region and the drain region, wherein at least a portion of the channel is under the first metal-containing layer;

forming a second metal-containing layer over the first metal-containing layer, wherein the second metal-containing layer has a second pre-anneal compressive/tensile stress, and wherein a combination of at least the second metal-containing layer over the first metal-containing layer forms a gate electrode stack; and annealing the gate electrode stack, wherein a composite post-anneal compressive/tensile stress of the gate electrode stack is less than an individual post-anneal compressive/tensile stress of either one of a separately annealed first metal-containing layer and a separately annealed second metal-containing layer.

2. The method of claim 1, wherein the first metal-containing layer includes titanium nitride.

3. The method of claim 1, wherein the first metal-containing layer includes a material selected from a group consisting of tungsten, tantalum, molybdenum, zirconium, and aluminum.

4. The method of claim 1, wherein forming the first metal-containing layer includes using a first deposition method, and wherein forming the second metal-containing layer includes using a second deposition method, wherein the first deposition method is a different deposition method than the second deposition method.

5. The method of claim 4, wherein the first deposition method includes a thermal chemical vapor deposition method.

6. The method of claim 1, wherein the individual post-anneal compressive/tensile stress of the first metal-containing layer is greater than approximately 500 megapascals.

7. The method of claim 1, wherein the second metal-containing layer includes titanium nitride.

8. The method of claim 1, wherein the second metal-containing layer comprises a material selected from a group consisting of tungsten, tantalum, molybdenum, zirconium, and aluminum.

9. The method of claim 1, wherein an individual post-anneal compressive/tensile stress of the second metal-containing material is greater than approximately 500 megapascals.

10. The method of claim 1, wherein the gate electrode stack is an inlaid gate electrode stack.

11. The method of claim 1, wherein annealing the gate electrode stack includes a furnace annealing process performed at a temperature in a range of approximately 700–950° C. and for a time in a range of approximately 5–30 minutes.

12. The method of claim 1, wherein annealing the gate electrode stack includes a rapid thermal annealing process performed at a temperature in a range of approximately 700–1100° C. and for a time less than approximately 1 minute.

13. The method of claim 1, wherein the post-anneal compressive/tensile stress of the gate electrode stack is less than approximately 800 megapascals.

14. The method of claim 1, further comprising forming a third metal-containing layer over the second meal-containing layer, wherein the post-anneal compressive/tensile stress of the rate electrode stack is less than a post-anneal compressive/tensile stress of the third metal-containing layer.

15. The method of claim 1, wherein forming the first metal-containing layer and forming the second metal-containing layer are performed using a same processing platform during a single evacuation cycle.

16. A method for forming a semiconductor device comprising:

forming a first dielectric layer over a substrate;

forming an opening in the first dielectric layer;

forming a first metal-containing layer within the opening;

forming a source region a drain region and a channel between the source region and the drain region, wherein at least a portion of the channel is under the first metal-containing layer;

forming a second metal-containing layer over the first metal-containing material, wherein a combination of the second metal-containing layer over the first metal-containing layer forms a portion of a gate electrode stack, and wherein a composite compressive/tensile stress of the portion of the gate electrode stack is less than an individual compressive/tensile stress of either one of the first metal-containing layer and the second metal-containing layer; and removing portions of the second metal-containing material and the first metal-containing material lying outside of the opening to form and inlaid gate electrode structure.

17. The method of claim 16, wherein the first metal-containing layer includes a material selected from a group consisting of titanium, tungsten, tantalum, molybdenum, zirconium, and aluminum.

18. The method of claim 16, wherein the second metal-containing layer includes a material selected from a group consisting of titanium, tungsten, tantalum, molybdenum, zirconium, and aluminum.

19. The method of claim 16, wherein at least one of the first metal-containing layer and the second metal-containing layer is formed using a process selected from a group consisting of physical vapor deposition, thermal chemical vapor deposition, and plasma enhanced chemical vapor deposition.

\* \* \* \* \*

UNITED STATES PATENT AND TRADEMARK OFFICE
CERTIFICATE OF CORRECTION

PATENT NO. : 6,255,204 B1
DATED : July 3, 2001
INVENTOR(S) : Tobin et al.

Page 1 of 1

It is certified that error appears in the above-identified patent and that said Letters Patent is hereby corrected as shown below:

Column 8, claim 14,
Line 42, change "rate" to -- gate --

Signed and Sealed this

Nineteenth Day of March, 2002

Attest:

JAMES E. ROGAN
Director of the United States Patent and Trademark Office

Attesting Officer